(12) United States Patent
Savariar-Hauck et al.

(10) Patent No.: US 7,582,407 B2
(45) Date of Patent: Sep. 1, 2009

(54) IMAGEABLE ELEMENTS WITH LOW PH DEVELOPER SOLUBILITY

(75) Inventors: Celin Savariar-Hauck, Badenhausen (DE); Alan S. Monk, Cheshire (GB); Gerhard Hauck, Badenhausen (DE)

(73) Assignee: Eastman Kodak Company, Rochester, NY (US)

( * ) Notice: Subject to any disclaimer, the term of this patent is extended or adjusted under 35 U.S.C. 154(b) by 13 days.

(21) Appl. No.: 11/774,626

(22) Filed: Jul. 9, 2007

(65) Prior Publication Data

US 2009/0017399 A1 Jan. 15, 2009

(51) Int. Cl.
*G03F 7/00* (2006.01)
*G03F 7/04* (2006.01)

(52) U.S. Cl. ................ 430/270.1; 430/271.1; 430/330; 430/434; 430/435; 430/302; 430/303; 430/905; 430/944; 430/945; 430/926

(58) Field of Classification Search ............. 430/270.1, 430/271.1, 302, 303, 905, 330, 434, 435, 430/944, 945, 926
See application file for complete search history.

(56) References Cited

U.S. PATENT DOCUMENTS

| | | | |
|---|---|---|---|
| 6,143,464 A | 11/2000 | Kawauchi | |
| 6,280,899 B1 | 8/2001 | Parsons et al. | |
| 6,294,311 B1 | 9/2001 | Shimazu et al. | |
| 6,352,811 B1 | 3/2002 | Patel et al. | |
| 6,352,812 B1 | 3/2002 | Shimazu et al. | |
| 6,358,669 B1 | 3/2002 | Savariar-Hauck et al. | |
| 6,391,524 B2 | 5/2002 | Yates et al. | |
| 6,485,890 B2 | 11/2002 | Parsons et al. | |
| 6,528,228 B2 | 3/2003 | Hauck et al. | |
| 6,555,291 B1 | 4/2003 | Hauck | |
| 6,558,869 B1 | 5/2003 | McCullough et al. | |
| 6,649,324 B1 * | 11/2003 | Fiebag et al. | 430/302 |
| 6,706,466 B1 | 3/2004 | Lott et al. | |
| 6,939,663 B2 * | 9/2005 | Tao et al. | 430/270.1 |
| 6,969,579 B1 * | 11/2005 | Kitson et al. | 430/271.1 |
| 6,992,688 B2 * | 1/2006 | Shimazu et al. | 347/171 |
| 7,060,410 B2 * | 6/2006 | Ohnishi et al. | 430/189 |
| 2002/0012878 A1 | 1/2002 | Hauck et al. | |
| 2004/0167312 A1 * | 8/2004 | Miyagi et al. | 528/129 |
| 2005/0069812 A1 | 3/2005 | Maemoto et al. | |
| 2006/0130689 A1 | 6/2006 | Muller et al. | |

FOREIGN PATENT DOCUMENTS

| | | |
|---|---|---|
| EP | 0 083 971 | 7/1983 |
| EP | 0 823 327 | 2/1998 |
| EP | 1 297 950 | 4/2003 |
| JP | 09015855 A * | 1/1997 |
| JP | 2001 114853 | 4/2001 |
| WO | WO 2005039878 A1 * | 5/2005 |

OTHER PUBLICATIONS

U.S. Appl. No. 11/686,981, filed Mar. 16, 2007, titled Processing Positive-Working Imageable Elements With High pH Developers, by Celin Savariar-Hauck et al.
U.S. Appl. No. 11/560,983, filed Nov. 17, 2006, titled Multilayer Element With Low pH Developer Solubility, by Celin Savariar-Hauck et al.

* cited by examiner

*Primary Examiner*—Amanda C. Walke
(74) *Attorney, Agent, or Firm*—J. Lanny Tucker

(57) ABSTRACT

Single- and multi-layer positive-working imageable elements include an ink receptive outer layer includes a primary polymeric binder that is a poly(vinyl phenol) or a phenolic polymer having certain acidic groups. The use of this type of polymeric binder makes the imaged elements developable in low pH (11 or less) alkaline developers.

20 Claims, No Drawings

IMAGEABLE ELEMENTS WITH LOW PH DEVELOPER SOLUBILITY

FIELD OF THE INVENTION

This invention relates to imageable elements having improved solubility after imaging in lower pH developers, and to methods of imaging and developing these imageable elements particularly to provide lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers. Thermally imageable, multi-layer elements are described, for example, in U.S. Pat. No. 6,294,311 (Shimazu et al.), U.S. Pat No. 6,352,812 (Shimazu et al.), U.S. Pat. No. 6,593,055 (Shimazu et al.), U.S. Pat. No. 6,352,811 (Patel et al.), and U.S. Pat. No. 6,528,228 (Savariar-Hauck et al.), and U.S. Patent Application Publication 2004/0067432 A1 (Kitson et al.). U.S. Patent Application Publication 2005/0037280 (Loccufier et al.) describes heat-sensitive printing plate precursors that comprise a phenolic developer-soluble polymer and an infrared radiation absorbing agent in the same layer.

Additional positive-working thermally imageable elements are described and used for making lithographic printing plates using various developers in U.S. Pat. No. 6,200,727 (Urano et al.), U.S. Pat. No. 6,358,669 (Savariar-Hauck et al.), and U.S. Pat. No. 6,534,238 (Savariar-Hauck et al.). In some instances, such imageable elements are developed using low pH developers when the upper layer includes novolak resins and dissolution suppressing agents.

Single-layer, positive-working imageable elements are described for example, in U.S. Pat. No. 6,280,899 (Hoare et al.), U.S.Pat.No. 6,391,524 (Yates et al.), U.S.Pat. No. 6,485,890 (Hoare et al.), U.S.Pat. No. 6,558,869 (Hearson et al.), and U.S. Pat. No. 6,706,466 (Parsons et al.), and U.S. Patent Application Publication 2006/0130689 (Müller et al.).

Copending and commonly assigned, U.S. application Ser. No. 11/686,981 (filed Mar. 16, 2006 by Savariar-Hauck et al.) describes and claims a method of processing using low pH developers in which the processed elements contain certain phenolic resins in the upper layer. Other imaged elements developable in low pH developers are described in U.S. Pat. No. 6,555,291 (Savariar-Hauck).

Problem to be Solved

After thermal imaging, the imaged positive-working elements are developed to remove exposed regions of all layers to expose the hydrophilic substrate. There is a desire to use lower pH developers (pH 11 or less) as the non-imaged (non-exposed) regions are more hydrophilic and this enables better press restart properties with less toning problems. This is true because the substrate interlayer is not removed during processing. However, the use of lower pH developers can lead to considerable residue build up in the developer due to insufficient solubility of removed polymeric binders. Build up of sludge or residue causes a number of maintenance problems including the use of large filter units besides lowering the useful life of the developer. There remains a need to provide alternative means for using lower pH developers without a buildup of significant residue or sludge in the developers.

SUMMARY OF THE INVENTION

This invention provides a positive-working imageable element comprising a substrate having thereon an ink receptive imageable layer comprising a primary polymeric binder that is soluble in an alkaline developer upon exposure to imaging radiation, the element further comprising a radiation absorbing compound, wherein the primary polymeric binder is a poly(vinyl phenol) or derivative thereof, or a phenolic polymer that comprises recurring units represented in the following Structure (I):

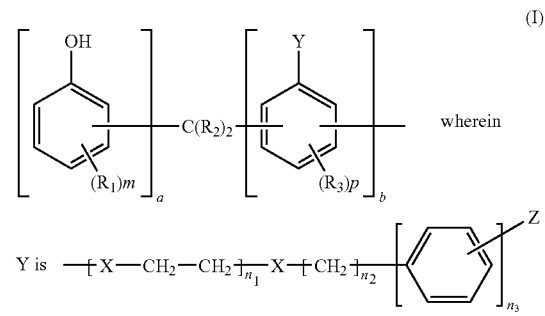

a is from about 90 to about 99 mol %, b is from about 1 to about 10 mol %, $R_1$ and $R_3$ are independently hydrogen or hydroxy, alkyl, or alkoxy groups, $R_2$ is hydrogen or an alkyl group, X is an alkylene, oxy, thio, —OC(=O)Ar—, —OC(=O)CH=CH—, or —OCO(CH$_2$)$_{n4}$— group wherein Ar is an aryl group, m and p are independently 1 or 2, n1 is 0 or an integer up to 5, n2 is 0 or an integer up to 5, n3 is 0 or 1, n4 is at least 1, and Z is —C(=O)OH, —S(=O)$_2$OH, —P(=O)(OH)$_2$, or —OP(=O)(OH)$_2$.

This invention also provides a method of making an imaged element (for example, a lithographic printing plate) comprising:

A) imagewise exposing an imageable element of this invention to provide both exposed and non-exposed regions in the imageable element, and B) developing the imagewise exposed imageable element to remove only the exposed regions.

The present invention includes positive-working elements having a single imageable layer as well as multiple layers (such as inner and outer layers).

The present invention allows for the optimal use of "negative"-type developers, or developers having relatively lower pH (11 or less) to process positive-working imageable elements. These imageable elements contain primary polymeric binders in the outermost ink-receptive layer that poly(vinyl phenols) or other phenolic resins that are very soluble in the lower pH developer by the incorporation of carboxy, sulfo, phosphoric, or phosphono groups in pendant groups. The presence of these acidic groups allows the use of phenolic binders without limitation as to their molecular weight with minimal residue or sludge build-up in the lower pH developers as the phenolic resins dissolve in the low pH developer as a result of the presence of acidic groups in the polymeric binder chain.

Furthermore, printing press restart toning, which is another problem often encountered when using high pH developer, can be solved by the use of the lower pH developers according to the present invention. This toning problem can occur when the printing press is stopped and restarted during a printing run. The ability to use higher molecular weight polymeric binders also provides the advantage that the run length and resistance to press room chemicals are improved.

DETAILED DESCRIPTION OF THE INVENTION

Definitions

Unless the context indicates otherwise, when used herein, the terms "imageable element", "positive-working imageable element", and "printing plate precursor" are meant to be references to embodiments of the present invention.

In addition, unless the context indicates otherwise, the various components described herein such as "primary polymeric binder", "secondary polymeric binder", "first polymeric binder", "second polymeric binder", "dissolution inhibitor", "added copolymer", "coating solvent", "radiation absorbing compound", "lower pH developer", and similar terms also refer to mixtures of such components. Thus, the use of the article "a" or "an" is not necessarily meant to refer to only a single component.

By "single-layer" imageable element, we mean an imageable element of this invention that has only a single layer needed for providing an image. The primary polymeric binder (defined below) would be located in this single imageable layer that is usually the outermost layer. However, such elements may comprise additional non-imaging layers on either side of the substrate.

By "multilayer" imageable element, we mean an imageable element of this invention that has at least two layers required for providing an image, for example, "inner" and "outer" layers as described below. However, such elements may comprise additional non-imaging layers on either side of the substrate.

By the term "remove said exposed regions" during development, we mean that the exposed regions of the outermost layer and the corresponding regions of any underlying layers are selectively and preferentially removed by the developer.

By "lower pH developer", we mean developers that have a pH of 11 or less, and generally a pH of from about 7 to about 11.

Unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements described herein can be used in a number of ways such as precursors to lithographic printing plates as described in more detail below. However, this is not meant to be their only use. For example, the imageable elements can also be used as thermal patterning systems and to form masking elements and printed circuit boards.

Primary Polymeric Binders

The primary polymeric binders providing the advantages of this invention are soluble in developers, especially low pH developers (defined below) and are poly(vinyl phenols) or derivatives thereof, or phenolic polymers. These polymeric binders are distinguishable from other polymeric binders that may be present in one or more layers of the imageable elements by the presence of carboxylic (carboxy), sulfonic (sulfo), phosphonic (phosphono), or phosphoric acid groups that are incorporated into the polymer molecule.

One group of useful primary polymeric binders are poly(vinyl phenol) and derivatives thereof. Such polymers are obtained generally by polymerization of vinyl phenol monomers, that is, substituted or unsubstituted vinyl phenols. Substituted vinyl phenol recurring units include those described below for the "a" recurring units in Structure (I). Some vinyl phenol copolymers are described in EP 1,669,803A (Barclay et al.).

The primary polymeric binders generally have an acid number of at least 15 and up to 100 and typically from about 15 to about 80.

Other useful primary polymeric binders are modified novolak or resole resins that are represented in the following Structure (I):

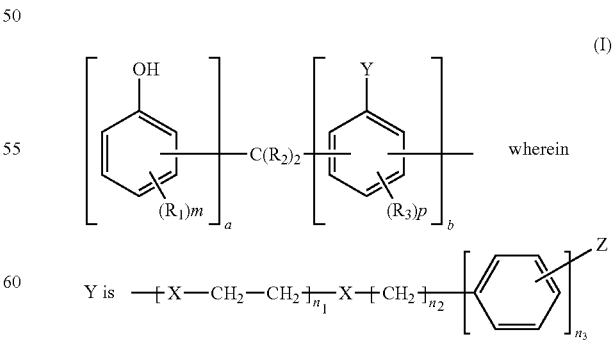

a is from about 90 to about 99 mol % (typically from about 92 to about 98 mol %), b is from about 1 to about 10 mol % (typically from about 2 to about 8 mol %), $R_1$ and $R_3$ are independently hydrogen or hydroxy, alkyl, or alkoxy groups, $R_2$ is hydrogen or an alkyl group, X is an alkylene, oxy, thio, —OC(=O)Ar—, —OC(=O)CH=CH—, or —OCO$(CH_2)_{n4}$— group wherein Ar is an aryl group, m and p are independently 1 or 2, n1 is 0 or an integer up to 5 (for example 0, 1, 2, or 3), n2 is 0 or an integer up to 5 (for example, 0, 1, or 2), n3 is 0 or 1 (typically 0), n4 is at least 1 (for example, up to 8), and Z is —C(=O)OH, —S(=O)$_2$OH, —P(=O)(OH)$_2$, or —OP(=O)(OH)$_2$.

In some embodiments, $R_1$ and $R_3$ are independently hydrogen or hydroxy, methyl, or methoxy groups, $R_2$ is hydrogen or a methyl group, X is a methylene, oxy, thio, —OC(=O)phenyl-, —OC(=O)CH=CH—, or —OCO$(CH_2)_{n4}$— group, n2 is 0, 1 or 2, n3 is 0, n4 is from 1 to 8, and Z is —C(=O)OH.

The alkyl and alkoxy groups present in the primary polymeric binders (for $R^1$, $R^2$, and $R^3$) can be unsubstituted or substituted with one or more halo, nitro, or alkoxy groups, and can have 1 to 3 carbon atoms. Such groups can be linear, branched, or cyclic (that is, "alkyl" also include "cycloalkyl" for purposes of this invention).

When X is alkylene, it can have 1 to 4 carbon atoms and be further substituted similarly to the alkyl and alkoxy groups. In addition, the alkylene group can be a substituted or unsubstituted cycloalkylene group having at least 5 carbon atoms in the ring and chain.

Ar is a substituted or unsubstituted, 6 or 10-membered carbocyclic aromatic group such as substituted or unsubstituted phenyl and naphthyl groups. Typically, Ar is an unsubstituted phenyl group.

In some embodiments, the imageable elements include a primary polymeric binder that is soluble upon exposure to imaging radiation only in an alkaline developer having a pH of from about 7 to about 11, comprises recurring units represented by Structure (I) wherein a is from about 92 to about 98 mol %, b is from about 2 to about 8 mol % and Z is —C(=O)OH, and is present in an outer layer (for example, in a multilayer imageable element) at a dry coverage of from about 15 to 100 weight % based on the total dry weight of the outer layer.

The primary polymeric binders represented by Structure (I) can be prepared in several ways. For example, in some embodiments, X is oxy, n1 and n3 are 0, n2 is 1, and Z is —C(=O)OH, as obtained by modifying phenolic resins with chloroacetic acid.

In other embodiments, X is oxy, n1 and n3 are 0, n2 is 2, and Z is —C(=O)OH, as obtained by modifying phenolic resins with chloropropionic acid.

In addition, novolak resins can be modified with cyclic anhydrides such as maleic anhydride to provide a polymeric binder wherein n1, n2, and n3 are all 0 and X is —OC(=O)CH=CH—, or modified with phthalic anhydrides wherein n1, n2, and n3 are all 0 and X is —OC(=O)Ar—, or modified with saturated cyclic anhydrides wherein n1, n2, and n3 were all 0, n4 was greater than 1, and X is —OC(=O)$(CH_2)_{n4}$.

In general terms, the primary polymeric binders represented by Structure (I) can be obtained by modifying a phenolic resin (ArOH) by reaction with a haloacetic acid [Halo-$(CH_2)_n$—COOH] in the presence of a halo acid.

The primary polymeric binder is present in the imageable layer at a dry coverage of from about 15 to 100 weight % (typically from about 30 to about 95 weight %) based on the total dry weight of that layer.

Single-Layer Imageable Elements

In the single-layer imageable elements include the primary polymeric binders as the predominant binders in the single and generally outermost imageable layer.

In general, single-layer imageable elements are formed by suitable application of an imageable layer formulation containing one or more primary polymeric binders to a suitable substrate to form an imageable layer. This substrate is usually treated or coated in various ways as described below prior to application of the formulation. The substrate can be treated to provide an "interlayer" for improved adhesion or hydrophilicity, and the single imageable layer is applied over the interlayer.

The substrate generally has a hydrophilic surface, or at least a surface that is more hydrophilic than the applied imageable layer formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support that may be coated or treated using techniques known in the art, including physical graining, electrochemical graining, chemical graining, and anodizing. For example, the aluminum sheet can be anodized using phosphonic acid or sulfuric acid using conventional procedures.

An optional interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 µm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press or a sleeve that is incorporated onto a press cylinder. The use of such imaged cylinders is described for example in U.S. Pat. No. 5,713,287 (Gelbart).

The single imageable layer comprises one or more of the primary polymeric binders generally in an amount of from about 15 to about 100 weight % and typically from about 30 to about 95 weight % (based on total dry imageable layer weight). The imageable layer is generally the outermost layer in the single-layer imageable element.

The imageable element also includes one or more radiation absorbing compounds. While these compounds can be sensitive to any suitable energy form (for example, UV or visible radiation), they are usually sensitive to infrared radiation and thus, the radiation absorbing compounds can be infrared radiation absorbing compounds ("IR absorbing compounds") that absorb radiation from about 600 to about 1200 nm and typically from about 700 to about 1200 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S. Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.),U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The radiation absorbing compound is generally present in the imageable element in an amount sufficient to render the imageable layer insoluble to an aqueous developer after exposure to appropriate radiation. This amount is generally at least 0.5% and up to 30 weight % and typically from about 3 to about 10 weight % (based on total dry layer weight). The particular amount needed for this purpose would be readily apparent to one skilled in the art, depending upon the specific compound used and the properties of the alkaline developer to be used. In most embodiments, the radiation absorbing compound is present in the single imageable layer. Alternatively or additionally, radiation absorbing compounds may be located in a separate layer that is in thermal contact with the single imageable layer. Thus, during imaging, the action of the radiation absorbing compound can be transferred to the imageable layer without the compound originally being incorporated into it.

In addition, solubility-suppressing components are optionally incorporated into the imageable layer. Such components act as dissolution inhibitors that function as solubility-suppressing components for the primary polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France).

The imageable layer also optionally includes one or more additional (or secondary) binder resins other than the primary polymeric binders defined above. Such secondary binder resins include phenolic resins such as novolak and resole resins, and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S.

Pat. No. 5,705,322 (West et al.). Other useful secondary binder resins include acrylate copolymers, cellulose esters, and poly(vinyl acetals) as described for example in U.S. Pat. No. 6,391,524 (Yates et al.) and DE 10 239 505 (Timpe et al.).

These secondary binder resins may be present in the imageable layer in an amount of from about 10 to about 80 weight % (based on total dry imageable layer weight).

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

The single-layer imageable element can be prepared by applying the layer formulation(s) over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve).

The coating weight for the single imageable layer can be from about 0.5 to about 2.5 g/m$^2$ and typically from about 1 to about 2 g/m$^2$.

The selection of solvents used to coat the imageable layer formulation depends upon the nature of the polymeric materials and other components in the formulations. Generally, the imageable layer formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art.

Alternatively, the layer(s) may be applied by conventional extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

Representative methods for preparing positive-working single-layer imageable elements of this invention are described below in Examples 7 and 8.

Multi-Layer Imageable Elements

In general, the multi-layer imageable elements comprise a substrate, an inner layer (also known in the art as an "underlayer"), and an outer layer (also known in the art as a "top layer" or "topcoat") disposed over the inner layer. Before thermal imaging, the outer layer is generally not soluble or removable by a developer, such as a lower pH developer, within the usual time allotted for development, but after thermal imaging, the exposed regions of the outer layer are soluble in the developer, such as a lower pH alkaline developer. The inner layer is also generally removable by the developer. An infrared radiation absorbing compound (described above) can also be present in such imageable elements, and is typically present in the inner layer but may optionally be in a separate layer between the inner and outer layers.

The imageable elements are formed by suitable application of an inner layer composition onto a suitable substrate. This substrate can be an untreated or uncoated support but it is usually treated or coated in various ways as described above prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates.

The inner layer is disposed between the outer layer and the substrate. Typically, it is disposed directly on the substrate (including any hydrophilic coatings as described above). The inner layer comprises a first polymeric binder that is removable by the lower pH developer and typically soluble in the developer to reduce sludging of the developer. In addition, the first polymeric binder is usually insoluble in the solvent used to coat the outer layer so that the outer layer can be coated over the inner layer without dissolving the inner layer. Mixtures of these first polymeric binders can be used if desired in the inner layer.

Useful first polymeric binders for the inner layer include (meth)acrylonitrile polymers, (meth)acrylic resins comprising carboxy groups, polyvinyl acetals, maleated wood rosins, styrene-maleic anhydride copolymers, (meth)acrylamide polymers including polymers derived from N-alkoxyalkyl methacrylamide, polymers derived from an N-substituted cyclic imide, polymers having pendant cyclic urea groups, and combinations thereof. First polymeric binders that provide resistance both to fountain solution and aggressive washes are disclosed in U.S. Pat. No. 6,294,311 (noted above).

Useful first polymeric binders include (meth)acrylonitrile polymers, and polymers derived from an N-substituted cyclic imide (especially N-phenylmaleimide), a (meth)acrylamide (especially methacrylamide), a monomer having a pendant cyclic urea group, and a (meth)acrylic acid (especially methacrylic acid). First polymeric binders of this type include copolymers that comprise from about 20 to about 75 mol % and typically about 35 to about 60 mol % or recurring units derived from N-phenylmaleimide, N-cyclohexyl-maleimide, N-(4-carboxyphenyl)maleimide, N-benzylmaleimide, or a mixture thereof, from about 10 to about 50 mol % and typically from about 15 to about 40 mol % of recurring units derived from acrylamide, methacrylamide, or a mixture thereof, and from about 5 to about 30 mol % and typically about 10 to about 30 mol % of recurring units derived from methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid. Optionally, these polymers can also include recurring units derived from (meth)acrylonitrile or N-[2-(2-oxo-1-imidazolidinyl)ethyl]-methacrylamide.

The bakeable inner layers described in WO 2005/018934 (Kitson et al.) and U.S. Pat. No. 6,893,783 (Kitson et al.) may also be used.

Other useful first polymeric binders can comprise, in polymerized form, from about 5 mol % to about 30 mol % (typically from about 10 mol % to about 30 mol % of recurring units) derived from an ethylenically unsaturated polymerizable monomer having a carboxy group (such as acrylic acid, methacrylic acid, itaconic acid, and other similar monomers known in the art (acrylic acid and methacrylic acid are preferred), from about 20 mol % to about 75 mol % (typically from about 35 mol % to about 60 mol %) of recurring units derived from N-phenylmaleimide, N-cyclohexylmaleimide, or a mixture thereof, optionally, from about 5 mol % to about 50 mol % (typically when present from about 15 mol % to about 40 mol %) of recurring units derived from methacrylamide, and from about 3 mol % to about 50 mol % (typically from about 10 mol % to about 40 mol % of one or more recurring units derived from monomer compounds of the following Structure (IV):

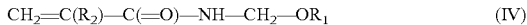

wherein $R_1$ is a $C_1$ to $C_{12}$ alkyl, phenyl, $C_1$ to $C_{12}$ substituted phenyl, $C_1$ to $C_{12}$ aralkyl, or $Si(CH_3)_3$, and $R_2$ is hydrogen or methyl. Methods of preparation of certain of these polymeric materials are disclosed in U.S. Pat. No. 6,475,692 (Jarek).

The first polymeric binder useful in the inner layer can also be hydroxy-containing polymeric material composed of recurring units derived from two or more ethylenically unsaturated monomers wherein from about 1 to about 50 mol % (typically from about 10 to about 40 mol %) of the recurring units are derived from on or more of the monomers represented by the following Structure (V):

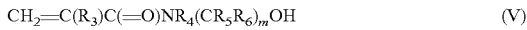

wherein $R_3$, $R_4$, $R_5$, $R_6$ are independently hydrogen, substituted or unsubstituted lower alkyl having 1 to 10 carbon atoms (such as methyl, chloromethyl, ethyl, iso-propyl, t-butyl, and n-decyl), or substituted or unsubstituted phenyl, and m is 1 to 20.

Some embodiments of hydroxy-containing first polymeric binders can be represented by the following Structure (VI):

wherein A represents recurring units represented by the following Structure (VII):

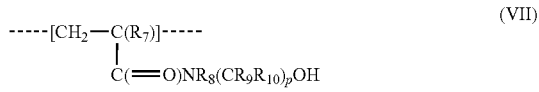

wherein $R_7$ through $R_{10}$ and p are as defined the same as $R_3$ through $R_6$ and m noted above for Structure (V).

In Structure (VI), B represents recurring units comprising acidic functionality or an N-maleimide group, and C represents recurring units different from A and B, x is from about 1 to about 50 mol % (typically from about 10 to about 40 mol %), y is from about 40 to about 90 mol % (typically from about 40 to about 70 mol %), and z is 0 to about 70 mol % (typically from 0 to about 50 mol %), based on total recurring units.

In some embodiments of Structure (VI):

A represents recurring units derived from one or both of N-hydroxymethylacrylamide and N-hydroxymethylmethacrylamide, B represents recurring units derived from one or more of N-phenylmaleimide, N-cyclohexylmaleimide, N-benzylmaleimide, N-(4-carboxyphenyl)maleimide, (meth)acrylic acid, and vinyl benzoic acid, C represents recurring units derived from one or more of a styrenic monomer (such as styrene and derivatives thereof), meth(acrylate) ester, N-substituted (meth)acrylamide, maleic anhydride, (meth)acrylonitrile, allyl acrylate, and a compound represented by the following Structure (VII):

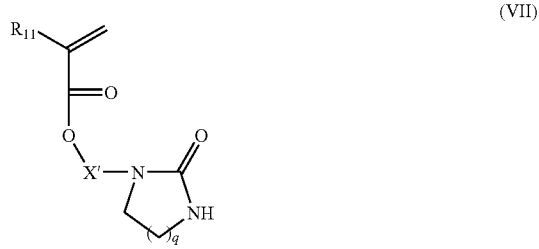

wherein $R_{11}$ is hydrogen, methyl, or halo, X' is alkylene having 2 to 12 carbon atoms, q is 1 to 3, x is from about 10 to 40 mol %, y is from about 40 to about 70 mol %, and z is from 0 to about 50 mol %, all based on total recurring units.

In some embodiments for Structure VI, B represents recurring units derived from at least one of N-phenylmaleimide, N-cyclohexylmaleimide, N-benzylmaleimide, N-(4-carboxyphenyl)maleimide in an amount of from about 20 to about 50 mol %, and recurring units derived from at least one of (meth) acrylic acid and vinyl benzoic acid in an amount of from about 10 to about 30 mol %, based on total recurring units.

In such embodiments, C represents recurring units derived from methacrylamide, (meth)acrylonitrile, maleic anhydride, or

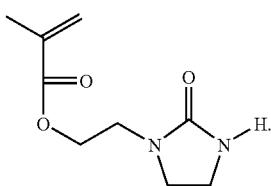

Still other useful first polymeric binders are addition or condensation polymers having a polymer backbone to which are attached pendant phosphoric acid groups, pendant adamantyl groups, or both types of pendant groups. The pendant adamantyl groups are connected to the polymer backbone at least through a urea or urethane linking group but other linking groups can also be present.

Useful first polymeric binders of this type can be represented by the following Structure (VIII):

wherein A and B together represents the polymer backbone in which A further comprises recurring units comprising pendant phosphoric acid groups, pendant adamantyl groups, or both, B further represents different recurring units, x represents 5 to 100 weight %, and y represents 0 to 95 weight %, provided that if A comprises pendant adamantyl groups, such groups are connected to the polymer backbone through a urea or urethane linking group (but other linking groups can also be present).

Such first polymeric binders can be represented by the following Structure (IX):

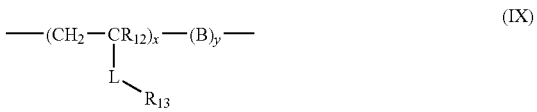

wherein $R_{12}$ represents hydrogen, a substituted or unsubstituted lower alkyl group having 1 to 4 carbon atoms (such as methyl, ethyl, n-propyl, or t-butyl), or a halo group.

L represents a direct bond or a linking group comprising 1 or more carbon atoms and optionally 1 or more heteroatoms in the linking chain. Useful linking groups can include, but are not limited to, substituted or unsubstituted, linear or branched alkylene groups having 1 to 10 carbon atoms (such as methylene, methoxymethylene, ethylene, iso-propylene, n-butylene, t-butylene, and n-hexylene), substituted or unsubstituted cycloalkylene groups having 5 to 10 carbon atoms in the cyclic group (such as 1,3-cyclopentylene and 1,4-cyclohexylene), substituted or unsubstituted arylene groups having 6 to 10 carbon atoms in the cyclic group (such as 1,4-phenylene, 3-methyl-1,4-phenylene, or naphthylene), or combinations thereof, such as arylenealkylene, alkylenearylene, and alkylenearylenealkylene groups. The L linking groups can also include one or more oxy, thio, amido, carbonyl, oxycarbonyl, carbonyloxy, carbonamido, sulfonamido, urea, urethane, and carbonate [—O—C(=O)—O—] groups within the linking chain, with or without any of the alkylene, cycloalkylene, and arylene groups described above. L can include combinations of two or more of these groups.

Preferably, L is a direct bond or one or more of alkylene groups having 1 to 4 carbon atoms in the linking chain, carbonyloxy, urea, urethane, alkyleneoxy, alkylenecarbonyloxy, and carboxyalkylene groups. For example, L can comprise at least one —C(=O)O— (carbonyloxy), —NH—C(=O)—NH— (urea), —C(=O)—O—(CH$_2$)$_2$—, or —NH—C(=O)—O— (urethane) group.

In Structure (IX), $R_{13}$ represents a pendant phosphoric acid group, a pendant adamantyl group, or both types of pendant groups. The solvent-resistant polymer can comprise one or more different recurring units having phosphoric acid groups or one or more different recurring units having adamantyl groups. Alternatively, the polymer can include a mixture of one or more different recurring units having phosphoric acid groups and one or more different recurring units having adamantyl groups. When R' is a pendant adamantyl group, L comprises a urea or urethane linking group within the linking chain.

In referring to "phosphoric acid" groups, it is also intended to include the corresponding salts of the phosphoric acid, including but not limited to, alkali metal salts and ammonium salts. Any suitable positive counterion can be used with the pendant phosphoric acid groups as long as the counterion does not adversely affect the performance of the resulting polymer or other desired imaging properties.

In still other embodiments of Structures VIII and IX, x is from about 5 to about 20 weight % and y is from about 80 to about 95 weight % when A represents recurring units comprising pendant phosphoric acid groups. Alternatively, x is from about 5 to about 40 weight % and B is from about 60 to about 95 weight % when A represents recurring units comprising pendant adamantyl groups.

Useful ethylenically unsaturated polymerizable monomers that can used to provide the A recurring units described above for Structures VIII and IX include, but are not limited to the following compounds represented by the following Structures A1 through A5:

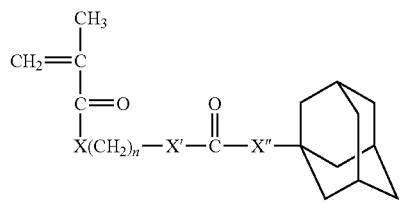

(A1)

wherein X is oxy, thio, or —NH—, X' is —NH— or oxy, X" is oxy or —NH—, and n is 1 to 6.

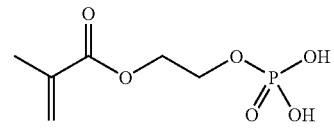

Ethylene glycol methacrylate phosphate (A2)

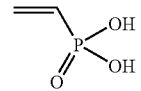

Vinyl phosphonic acid (A3)

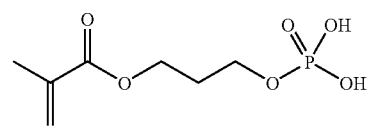

1,3-Propylene glycol methacrylate phosphate (A4)

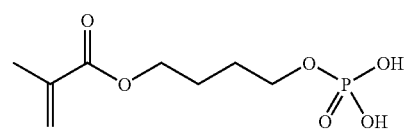

1,4-n-Butylene glycol methacrylate phosphate (A5)

In Structures (VIII) and (IX), B represents recurring units derived from one or more ethylenically unsaturated polymerizable monomers that do not have pendant phosphoric acid groups or adamantyl groups. A variety of monomers can be used for providing B recurring units, including styrenic monomers, (meth)acrylamide, (meth)acrylic acids or esters thereof, (meth)acrylonitrile, vinyl acetate, maleic anhydride, N-substituted maleimide, or mixtures thereof.

The recurring units represented by B can be derived from styrene, N-phenylmaleimide, methacrylic acid, (meth)acrylonitrile, or methyl methacrylate, or mixtures of two or more of these monomers.

In some embodiments, the first polymeric binder can be represented by Structure (VIII) described above in which x is from about 5 to about 30 weight % (more typically, from about 5 to about 20 weight %) and B represents recurring units derived from:

a) one or more of styrene, N-phenylmaleimide, methacrylic acid, and methyl methacrylate, wherein these recurring units comprise from 0 to about 70 weight % (typically from about 10 to about 50 weight %) of all recurring units in the solvent-resistant polymer, and b) one or more of acrylonitrile or methacrylonitrile, or mixtures thereof, wherein these recurring units comprise from about 20 to about 95 weight % (typically from about 20 to about 60 weight %) of all recurring units.

Still other useful first polymeric binders comprise a backbone and have attached to the backbone the following Structure Q group:

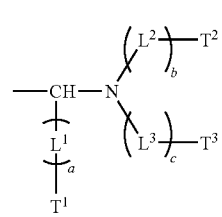

(Q)

wherein $L^1$, $L^2$, and $L^3$ independently represent linking groups, $T^1$, $T^2$, and $T^3$ independently represent terminal groups, and a, b, and c are independently 0 or 1.

More particularly, each of $L^1$, $L^2$, and $L^3$ is independently a substituted or unsubstituted alkylene having 1 to 4 carbon atoms (such as methylene, 1,2-ethylene, 1,1-ethylene, n-propylene, iso-propylene, t-butylene, and n-butylene groups), substituted cycloalkylene having 5 to 7 carbon atoms in the cyclic ring (such as cyclopentylene and 1,4-cyclohexylene), substituted or unsubstituted arylene having 6 to 10 carbon atoms in the aromatic ring (such as 1,4-phenylene, naphthylene, 2-methyl-1,4-phenylene, and 4-chloro-1,3-phenylene groups), or substituted or unsubstituted, aromatic or non-aromatic divalent heterocyclic group having 5 to 10 carbon and one or more heteroatoms in the cyclic ring (such as pyridylene, pyrazylene, pyrimidylene, or thiazolylene groups), or any combinations of two or more of these divalent linking groups. Alternatively, $L^2$ and $L^3$ together can represent the necessary atoms to form a carbocyclic or heterocyclic ring structure. For example, $L^1$ can be a carbon-hydrogen single bond or a methylene, ethylene, or phenylene group, and $L^2$ and $L^3$ are independently hydrogen, methyl, ethyl, 2-hydroxyethyl, or cyclic —$(CH_2)_2$—O—$(CH_2CH_2)$— groups.

$T^1$, $T^2$, and $T^3$ are independently terminal groups such as hydrogen, or substituted or unsubstituted alkyl groups having 1 to 10 carbon atoms (such as methyl, ethyl, iso-propyl, t-butyl, n-hexyl, methoxymethyl, phenylmethyl, hydroxyethyl, and chloroethyl groups), substituted or unsubstituted alkenyl groups having 2 to 10 carbon atoms (such as ethenyl and hexenyl groups), substituted or unsubstituted alkynyl groups (such as ethynyl and octynyl groups), substituted or unsubstituted cycloalkyl groups having 5 to 7 carbon atoms in the cyclic ring (such as cyclopentyl, cyclohexyl, and cycloheptyl groups), substituted or unsubstituted heterocyclic groups (both aromatic and non-aromatic) having a carbon atom and one or more heteroatoms in the ring (such as pyridyl, pyrazyl, pyrimidyl, thiazolyl, and indolyl groups), and substituted or unsubstituted aryl groups having 6 to 10 carbon atoms in the aromatic ring (such as phenyl, naphthyl, 3-methoxyphenyl, benzyl, and 4-bromophenyl groups). Alternatively, $T^2$ and $T^3$ together represent the atoms necessary to form a cyclic structure that can also contain fused rings. In addition, when "a" is 0, $T^3$ is not hydrogen.

In some embodiments, the Structure Q group can be directly attached to an α-carbon atom in the polymer backbone, the α-carbon atom also having attached thereto an electron withdrawing group. In other embodiments, the Structure Q group is indirectly attached to the polymer backbone through a linking group.

These first polymeric binders can be prepared by the reaction of an α-hydrogen in the polymer precursor with a first compound comprising an aldehyde group and a second compound comprising an amine group as described in U.S. Patent Application Publication 2005/0037280 (Loccufier et al.).

The first polymeric binders can also be represented by the following Structure (X):

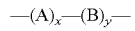 (X)

wherein A represents recurring units derived from one or more ethylenically unsaturated polymerizable monomers that comprise the same or different Q groups, B represents recurring units derived from one or more different ethylenically unsaturated polymerizable monomers that do not comprise Q groups.

More particularly, the A recurring units in Structure X can be represented by the following Structure (Xa) or (Xb):

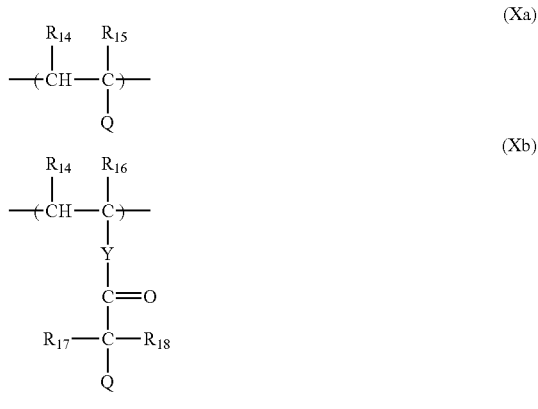

wherein $R_{14}$ and $R_{16}$ are independently hydrogen or a halo, substituted or unsubstituted alkyl having 1 to 7 carbon atoms (such as methyl, ethyl, n-propyl, iso-propyl, or benzyl), or a substituted or unsubstituted phenyl group. For example, $R_{14}$ and $R_{16}$ can be independently hydrogen or a methyl or halo group, and preferably they are independently hydrogen or methyl.

$R_{15}$ in Structure Xa is an electron withdrawing group as defined above including but are not limited to, cyano, nitro, substituted or unsubstituted aryl groups having 6 to 10 carbon atoms in the carbocyclic ring, substituted or unsubstituted heteroaryl groups having 5 to 10 carbon, sulfur, oxygen, or nitrogen atoms in the heteroaromatic ring, —C(=O)OR$_{20}$, and —C(=O)R$_{20}$ groups wherein $R_{20}$ is hydrogen or a substituted or unsubstituted alkyl having 1 to 4 carbon atoms (such as methyl, ethyl, n-propyl, t-butyl), a substituted or unsubstituted cycloalkyl (such as a substituted or unsubstituted cyclohexyl), or a substituted or unsubstituted aryl group (such as substituted or unsubstituted phenyl). The cyano, nitro, —C(=O)OR$_{20}$, and —C(=O)R$_{20}$ groups are useful and cyano, —C(=O)CH$_3$, and —C(=O)OCH$_3$ are more useful.

$R_{17}$ and $R_{18}$ in Structure (Xb) are independently hydrogen or a substituted or unsubstituted alkyl group having 1 to 6 carbon atoms (such as such as methyl, ethyl, n-propyl, t-butyl, n-hexyl), substituted or unsubstituted cycloalkyl having 5 or 6 carbon atoms (such as cyclohexyl), a substituted or unsubstituted aryl group having 6 to 10 carbon atoms (such as phenyl, 4-methylphenyl, and naphthyl), or a —C(=O)R$_{19}$ group wherein $R_{19}$ is a substituted or unsubstituted alkyl group (as defined for $R_{17}$ and $R_{18}$), a substituted or unsubstituted alkenyl group having 2 to 8 carbon atoms (such as ethenyl and 1,2-propenyl), a substituted or unsubstituted cycloalkyl group (as defined above for $R_{17}$ and $R_{18}$), or a substituted or unsubstituted aryl group (as defined above for $R_{17}$ and $R_{18}$). Preferably, $R_{17}$ and $R_{18}$ are independently hydrogen or a substituted or unsubstituted alkyl, cycloalkyl, aryl, or —C(=O)R$_{1g}$ groups as defined above wherein $R_{19}$ is an alkyl having 1 to 4 carbon atoms.

In Structure (Xb), Y is a direct bond or a divalent linking group. Useful divalent linking groups include but are not limited to oxy, thio, —NR$_{21}$—, substituted or unsubstituted alkylene, substituted or unsubstituted phenylene, substituted or unsubstituted heterocyclylene, —C(=O)—, and —C(=O)O— groups, or a combination thereof wherein $R_{21}$ is hydrogen or a substituted or unsubstituted alkyl, substituted or unsubstituted cycloalkyl, or substituted or unsubstituted aryl group, as defined above for $R_{17}$ and $R_{18}$. For example, Y is a direct bond or an oxy, —C(=O)O—, —C(=O)OCH$_2$CH$_2$O—, or —C(=O)CH$_2$CH$_2$C(=O)CH$_2$— group.

In Structure (X), x is from about 1 to about 70 mol %, and y is from about 30 to about 99 mol %, based on total recurring units. More typically, x is from about 5 to about 50 mol % and y is from about 50 to about 95 mol %, based on total recurring units.

Also in Structure (X), B can represent recurring units derived from a wide variety of ethylenically unsaturated polymerizable monomers. Particularly useful recurring units are derived from one or more N-substituted maleimides, N-substituted (meth)acrylamides, unsubstituted (meth)acrylamides, (meth)acrylonitriles, or vinyl monomers having an acidic group, and more preferably from one or more N-phenylmaleimides, N-cyclohexylmaleimides, N-benzylmaleimides, N-(4-carboxyphenyl)maleimides, (meth)acrylic acids, vinyl benzoic acids, (meth)acrylamides, and (meth)acrylonitriles. Several of these monomers can be copolymerized to provide multiple types of B recurring units. Useful combinations of B recurring units include those derived from two or more of methacrylic acid, methacrylamide, and N-phenylmaleimide.

The first polymeric binders are the predominant polymeric materials in the inner layer. That is, they comprise more than 50% and up to 100% (dry weight) of the total polymeric materials in the inner layer. However, the inner layer may also comprise one or more primary additional polymeric materials, provided these primary additional polymeric materials do not adversely affect the chemical resistance and solubility properties of the inner layer.

Useful primary additional polymeric materials include copolymers that comprises from about 1 to about 30 mole % of recurring units derived from N-phenylmaleimide, from about 1 to about 30 mole % of recurring units derived from methacrylamide, from about 20 to about 75 mole % of recurring units derived from acrylonitrile, and from about 20 to about 75 mole % of recurring units derived from one or more monomers of the Structure (XI):

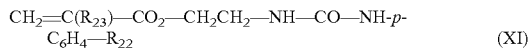

CH$_2$=C(R$_{23}$)—CO$_2$—CH$_2$CH$_2$—NH—CO—NH-p-C$_6$H$_4$—R$_{22}$     (XI)

wherein $R_{22}$ is OH, COOH, or SO$_2$NH$_2$, and $R_{23}$ is H or methyl, and, optionally, from about 1 to about 30 mole % from about 3 to about 20 mole % of recurring units derived from one or more monomers of the Structure (XII):

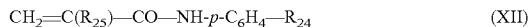

CH$_2$=C(R$_{25}$)—CO—NH-p-C$_6$H$_4$—R$_{24}$     (XII)

wherein $R_{24}$ is OH, COOH, or SO$_2$NH$_2$, and $R_{25}$ is H or methyl.

The inner layer may also comprise one or more secondary additional polymeric materials that are resins having activated methylol and/or activated alkylated methylol groups. These "secondary additional polymeric materials" in the inner layer should not be confused with the "second polymeric binder" used in the outer layer.

The secondary additional polymeric materials can include, for example resole resins and their alkylated analogs, methylol melamine resins and their alkylated analogs (for example melamine-formaldehyde resins), methylol glycoluril resins and alkylated analogs (for example, glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Useful secondary additional polymeric materials can also include copolymers that comprise from about 25 to about 75 mole % of recurring units derived from N-phenylmaleimide, from about 10 to about 50 mole % of recurring units derived from methacrylamide, and from about 5 to about 30 mole % of recurring units derived from methacrylic acid. These secondary additional copolymers are disclosed in U.S. Pat. Nos. 6,294,311 and 6,528,228 (both noted above).

Thus, the first polymeric binder can be a (meth)acrylic resin comprising carboxy groups, a maleated wood rosin, a styrene-maleic anhydride copolymer, a (meth)acrylamide polymer, a (meth)acrylonitrile polymer, a polymer derived from an N-substituted cyclic imide, a polymer having pendant cyclic urea groups, or polymers derived from an N-alkoxyalkyl methacrylamide.

The first polymeric binder and the primary and secondary additional polymeric materials useful in the inner layer can be prepared by methods, such as free radical polymerization, that are well known to those skilled in the art and that are described, for example, in Chapters 20 and 21, of *Macromolecules*, Vol. 2, 2nd Ed., H. G. Elias, Plenum, New York, 1984. Useful free radical initiators are peroxides such as benzoyl peroxide, hydroperoxides such as cumyl hydroperoxide and azo compounds such as 2,2'-azobis(isobutyronitrile) (AIBN). Suitable reaction solvents include liquids that are inert to the reactants and that will not otherwise adversely affect the reaction.

In most embodiments, the inner layer further comprises an infrared radiation absorbing compound ("IR absorbing compounds") that absorbs radiation at from about 600 to about 1200 and typically at from about 700 to about 1200 nm, with minimal absorption at from about 300 to about 600 nm. Examples of useful radiation absorbing compounds are described above. In most embodiments, the infrared radiation absorbing compound is present only in the inner layer.

The infrared radiation absorbing compound can be present in the multi-layer imageable element in an amount of generally at least 0.5% and up to 30% and typically from about 3 to about 25%, based on the total dry weight of the element. The particular amount of a given compound to be used could be readily determined by one skilled in the art.

The inner layer can include other components such as surfactants, dispersing aids, humectants, biocides, viscosity builders, drying agents, defoamers, preservatives, antioxidants, and colorants.

The inner layer generally has a dry coating coverage of from about 0.5 to about 2.5 g/m$^2$ and typically from about 1 to about 2 g/m$^2$. The first polymeric binders described above generally comprise at least 50 weight % and typically from about 60 to about 90 weight % based on the total dry layer weight, and this amount can be varied depending upon what other polymers and chemical components are present. Any primary and secondary additional polymeric materials (such as a novolak, resole, or copolymers noted above) can be present in an amount of from about 5 to about 45 weight % based on the total dry weight of the inner layer.

The outer layer of the imageable element is disposed over the inner layer and in most embodiments there are no intermediate layers between the inner and outer layers. The outer layer comprises a second polymeric binder that is different than the first polymeric binder described above. This second polymeric binder comprises one or more of the primary polymeric binders as defined above. The outer layer is substantially free of infrared radiation absorbing compounds, meaning that none of these compounds are purposely incorporated therein and insubstantial amounts diffuse into it from other layers.

The one or more second polymeric binders are present in the outer layer at a dry coverage of from about 15 to 100 weight %, typically from about 70 to about 98 weight %, based on total dry weight of the outer layer.

The outer layer can also include colorants. Useful colorants are described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imageable element.

The outer layer can optionally also include contrast dyes, printout dyes, coating surfactants, dispersing aids, humectants, biocides, viscosity builders, drying agents, defoamers, preservatives, and antioxidants.

The outer layer generally has a dry coating coverage of from about 0.2 to about 2 g/m$^2$ and typically from about 0.4 to about 1.5 g/m$^2$.

There may be a separate layer that is between and in contact with the inner and outer layers. This separate layer can act as a barrier to minimize migration of radiation absorbing compound(s) from the inner layer to the outer layer. This separate "barrier" layer generally comprises a third polymeric binder that is soluble in the alkaline developer. If this third polymeric binder is different from the first polymeric binder(s) in the inner layer, it is typically soluble in at least one organic solvent in which the inner layer first polymeric binders are insoluble. A useful third polymeric binder is a poly(vinyl alcohol). Generally, this barrier layer should be less than one-fifth as thick as the inner layer, and typically less than one-tenth as thick as the inner layer.

Alternatively, there may be a separate layer between the inner and outer layers that contains the infrared radiation absorbing compound(s), which may also be present in the inner layer, or solely in the separate layer.

Preparation of Multi-Layer Imageable Elements

The multi-layer imageable element can be prepared by sequentially applying an inner layer formulation over the surface of the hydrophilic substrate (and any other hydrophilic layers provided thereon), and then applying an outer layer formulation over the inner layer using conventional coating or lamination methods. It is important to avoid intermixing of the inner and outer layer formulations.

For example, a multi-layer imageable element can be prepared with an inner layer comprising a first polymeric binder and a radiation absorbing compound, and an ink receptive outer layer comprising a second polymeric binder that: (1) is different than the first polymeric binder, (2) is soluble in an alkaline developer upon exposure to imaging radiation, and (3) is a poly(vinyl phenol) or derivative thereof, or a phenolic polymer that comprises recurring units represented by Structure (I).

The inner and outer layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depends upon the nature of the first and second polymeric binders, other polymeric materials, and other components in the formulations. To prevent the inner and outer layer formulations from mixing or the inner layer from dissolving when the outer layer formulation is applied, the outer layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

Alternatively, the inner and outer layers may be applied by extrusion coating methods from melt mixtures of the respective layer compositions. Typically, such melt mixtures contain no volatile organic solvents.

Intermediate drying steps may be used between applications of the various layer formulations to remove solvent(s) before coating other formulations. Drying steps may also help in preventing the mixing of the various layers.

After drying the layers, the element can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the imageable element is wrapped or encased in a water-impermeable sheet material to represent an effective barrier to moisture removal from the precursor, or the heat treatment of the imageable element is carried out in an environment in which relative humidity is controlled to at least 25%. In addition, the water-impermeable sheet material can be sealed around the edges of the imageable element, with the water-impermeable sheet material being a polymeric film or metal foil that is sealed around the edges of the imageable element.

In some embodiments, this heat treatment can be carried out with a stack comprising at least 100 of the same imageable elements, or when the imageable element is in the form of a coil or web.

Representative methods for preparing multi-layer imageable elements of this invention are shown in Examples 1-6 below.

Imaging and Development

The single- and multi-layer imageable elements can have any useful form including, but not limited to, printing plate precursors, printing cylinders, printing sleeves (solid or hollow cores) and printing tapes (including flexible printing webs). For example, the imageable members can be printing plate precursors useful for providing lithographic printing plates.

Printing plate precursors can be of any size or shape (for example, square or rectangular) having the requisite one or more imageable layers disposed on a suitable substrate. Printing cylinders and sleeves are known as rotary printing members having a substrate and at least one imageable layer in cylindrical form. Hollow or solid metal cores can be used as substrates for printing sleeves.

During use, the single- and multi-layer imageable elements are exposed to a suitable source of radiation such as UV, visible, or infrared radiation, depending upon the radiation absorbing compound present in the element, for example at a wavelength of from about 300 to about 1400 nm. In some embodiments, imaging can be carried out using an infrared laser at a wavelength of from about 600 to about 1500 nm and typically from about 700 to about 1200 nm. The lasers used to expose the imageable elements are usually diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus are available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 mJ/cm$^2$, and typically from about 75 to about 400 mJ/cm$^2$.

While laser imaging is useful in the practice of this invention, imaging can be provided by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable lower pH developer removes the exposed regions of the outer layer and the underlying portions of underlayers (including the inner layer), and exposes the hydrophilic surface of the substrate. Thus, the imageable elements are "positive-working" (for example, positive-working lithographic printing plate precursors). The exposed (or imaged) regions of the hydrophilic surface repel ink while the non-exposed (or non-imaged) regions of the outer layer accept ink.

Development is carried out for a time sufficient to remove the imaged (exposed) regions of the imaged element, but not long enough to remove the non-exposed regions. Because of the nature of the primary polymeric binder(s) used in the imageable layer, removal of the exposed regions readily occurs during development but the removed portions of the imageable layer are readily soluble in the lower pH developer, thereby reducing sludge or residue in the developer.

The imaged elements are generally developed using conventional processing conditions using the lower pH developers described below. These developers generally have a pH of 11 or less and typically from about 7 to about 11, or from about 7 to about 10.

These lower pH developers used in the present invention are generally single-phase solutions of water and one or more organic solvents that are miscible with water. Useful organic solvents can contain the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, or ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. The developer typically comprises benzyl alcohol, 2-phenoxyethanol, or both.

Representative lower pH developers useful in this invention include but are not limited to, ND-1 Developer, 955 Developer, 956 Developer, 989 Developer, and 980 Developer (all available from Eastman Kodak Company), HDN-1 Developer (available from Fuji), and EN 232 Developer (available from Agfa). These lower pH developers can be used to advantage in the methods of this invention in combination with unique polymeric binder in the imageable layer to provide desired advantages.

Generally, the lower pH developer is applied to the imaged element by rubbing or wiping the outer layer with an applicator containing the developer. Alternatively, the imaged element can be brushed with the developer or the developer may be applied by spraying the outer layer with sufficient force to remove the exposed regions. The imaged element can be immersed in the developer. In all instances, a developed image is produced, particularly in a lithographic printing plate.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

A lithographic ink and fountain solution can be applied to the printing surface of the imaged element for printing. The non-exposed regions of the outermost layer take up ink and the hydrophilic surface of the substrate revealed by the imaging and development process takes up the fountain solution. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

EXAMPLES

The components and materials used in the examples and analytical methods were as follows. Unless otherwise indicated, the components can be obtained from various commercial sources such as Aldrich Chemical Co. (Milwaukee, Wis.).

BLO is γ-butyrolactone.

Byk® 307 is a polyethoxylated dimethylpolysiloxane copolymer that is available from Byk Chemie (Wallingford, Conn.) in a 25 wt. % xylene/methoxypropyl acetate solution.

Copolymer A represents a copolymer having recurring units derived from N-phenylmaleimide, methacrylamide, methacrylic acid, and N-(2-methacryloyloxyethyl)ethylene urea (from Degussa) (37:20:14:29 monomer mole % ratio) using conventional conditions and procedures, and having an acid number of 52.

Copolymer B is a the product obtained by stirring 20 g of Copolymer A dissolved in 100 g of methoxyethanol with 0.19 g of sodium hydroxide and 3.53 g of IR Dye A (below), precipitating after 4 hours in 1 liter of water, filtering, and drying the product at 40° C. for 24 hours.

Copolymer C is a copolymer having recurring units derived from N-phenylmaleimide, methacrylamide, and methacrylic acid (41.5:37.5:21 mol % ratio) that was obtained from AZ Electronics (Germany).

Crystal Violet is C.I. 42555, Basic Violet 3 with $\lambda_{max}$=588 nm.

D11 represents a triarylmethane dye (CAS 433334-91).

DEK represents diethyl ketone.

Dowanol® PM is propylene glycol methyl ether that was obtained from Dow Chemical (Midland, Mich.). It is also known as PGME.

Dowanol® PMA is 1-methoxy-2-propyl acetate (or "PMA").

Ethyl violet is assigned C.I. 42600 (CAS 2390-59-2, $\lambda_{max}$=596 nm) and has a formula of p-$(CH_3CH_2)_2NC_6H_4)_3C^+$ $Cl^-$.

IR Dye A (Trump) is represented by the following formula and can be obtained from Eastman Kodak Company (Rochester, N.Y.):

IR Dye A

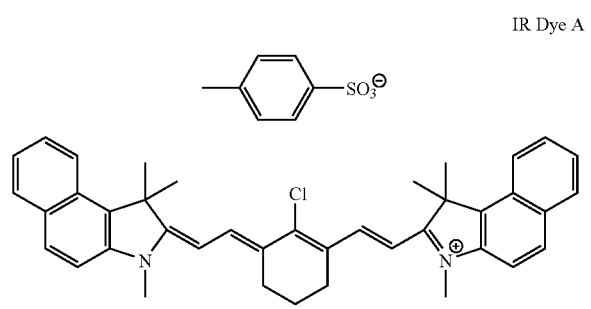

LB744 represents a cresol novolak that was obtained from Hexion Specialty Chemicals (Columbus, Ohio).

MEK represents methyl ethyl ketone.

N13 represents a m-cresol novolak that was used as a dry resin obtained by precipitating an N13P acetone solution that was obtained from Eastman Kodak (Rochester, N.Y.), in water an drying overnight.

PA300 represents a pyrogallol-acetone condensed product that was obtained from PCAS (France).

PD 140 (sometimes known as PD 140A) represents a novolak resin that was obtained from Borden Chemical Co. (Columbus, Ohio).

PD494 is a novolak resin condensed from m-/p-cresol with formaldehyde and available from Borden Chemical Company (Columbus, Ohio).

P3000 represents a pyrogallol-acetone novolak that was derivatized with naphthoquinonediazide and was obtained from PCAS (France).

Pro-Jet 825 is an IR dye that is available from Avecia (United Kingdom).

SP 1077 is an octylphenol novolak resin that is available from Schenectady Chemicals (Schenectady, N.Y.).

Substrate A is a 0.3 mm gauge aluminum sheet that had been electrograined, anodized, and subjected to treatment poly(vinyl phosphonic acid).

956 and 980 Developers are available from Eastman Kodak Company (Norwalk, Conn.).

6564LB is a novolak resin condensed from p-cresol/phenol with formaldehyde and available from either Borden Chemical Company.

Synthetic Examples

Primary polymeric binders according to the present invention were prepared in the following manner:

A 500 ml 3-neck round-bottomed flask fitted with reflux was set-up in a thermostatic water bath. To the flask containing 19.22 g of LB744 dissolved in 50 ml of Dowanol® PM were added 3.20 g of sodium hydroxide pellets and stirred to give a dark brown solution. To this solution was added 3.78 g of chloroacetic acid and reaction was allowed with stirring and heating at 85° C. After 5 hours, the solution was allowed to cool and 8.61 g of hydrochloric acid (33%) were added and stirred continued for 10 minutes. The solution was then poured into 150 ml of water, resulting in a sticky precipitate. The remaining liquid was decanted off and 250 ml of water was added and the precipitate ground to a fine powder with a high-speed stirrer. After allowing to the powder to settle, the resulting polymer was filtered and dried at 40° C. for 22 hours.

An Infrared Spectra of the modified resins showed clearly the presence of the carbonyl band at approx. 1730, which band was absent in the spectrum of the starting resin.

The various primary polymeric binder modifications are shown in the TABLE I below.

TABLE I

| Primary Polymer Binder (PPB) | Starting Novolak | Grams Novolak | Grams ClCH$_2$COOH | NaOH | HCl | Theo. Acid No. |
|---|---|---|---|---|---|---|
| PPB 1 | LB744 | 19.22 | 3.78 | 3.20 | 8.61 | 104 |
| PPB 2 | LB744 | 20.19 | 3.02 | 2.56 | 6.88 | 80 |
| PPB 3 | LB744 | 21.63 | 1.89 | 1.60 | 4.30 | 52 |
| PPB 4 | LB744 | 21.63 | 6.62 | 5.60 | 15.06 | 152 |
| PPB 5 | LB744 | 21.63 | 7.60* | 5.60 | 15.06 | 162 |
| PPB 6 | N13 | 21.03 | 7.09 | 6.00 | 16.14 | 184 |

*ClCH$_2$CH$_2$COOH

Invention Examples 1-6

Multi-layer imageable elements of the present invention were prepared as follows:

Inner layer formulation 1 was prepared by dissolving Copolymer A (5.0 g) and IR Dye A (0.7 g) in 90 ml of a solvent mixture comprising MEK (45 wt. %), PMA (35 wt. %), BLO (10 wt. %), and water (10 wt. %) and coating it onto Substrate A and drying at 135° C. for 45 seconds to provide a dry coating weight of 1.35 g/m$^2$.

Inner layer formulation 2 was prepared by dissolving Copolymer B in 90 ml of a solvent mixture comprising MEK (45 wt. %), PMA (35 wt. %), BLO (10 wt. %), and water (10 wt. %) and coating it onto Substrate A and drying at 135° C. for 45 seconds to provide a dry coating weight of 1.35 g/m$^2$.

Outer layer formulations were prepared by dissolving 2.38 g of the primary polymeric binders shown in TABLE II below, Byk® 307 (0.03 g), and ethyl violet (0.032 g) in 40 g of a solvent mixture (DEK:PMA, 9:1 weight ratio), coated over the dried inner layer noted in TABLE II, and dried at 135° C. for 45 seconds to provide a dry coating weight of 0.55-65 g/m$^2$.

Samples of the resulting imageable elements were imaged at 9 W and a drum speed of 150 to 360 rpm (about 67 to 161 mJ/cm$^2$) in steps of 30 rpm on a Creo Quantum® 800 imagesetter. The imaged elements were developed with 980 Developer in a Glunz and Jensen processor at 120 cm/min to provide lithographic printing plates. The Clear Point of each imaged plate is noted in TABLE II. "Clear point" refers to the minimum imaging energy required to obtain a clean background in the non-imaged regions.

980 Developer Solubility was evaluated by dissolving 0.30 of the polymeric resin in 30 ml of the developer while stirring. The results are shown in TABLE II below.

The UV/white light sensitivity was tested by exposing samples of the non-imaged elements of each of Invention Example 1-6 to 250 mJ/cm$^2$ UV floodwise exposure. Other samples of the same elements were imaged and processed without any exposure to UV. No difference was seen in the image quality between the UV-exposed and non-UV-exposed elements.

TABLE II

| | Inner Layer | Primary Polymeric Binder | Image Quality | 980 Developer Solubility | Clear Point (mJ/cm$^2$) |
|---|---|---|---|---|---|
| Invention Example 1 | 1 | PPB 1 | Excellent | Soluble | 97 |
| Invention Example 2 | 1 | PPB 3 | Excellent | Partly soluble | 97 |
| Invention Example 3 | 1 | Synthesis Example 2 | Poor | <15 minutes | Not available |
| Invention Example 4 | 1 | PPB 5 | Excellent | <15 minutes | 89 |
| Invention Example 5 | 2 | Synthesis Example 4 | Poor | <15 minutes | Not available |
| Invention Example 6 | 1 | Synthesis Example 6 | Poor | <15 minutes | Not available |
| Comparative Example 1 | 1 | PD140A + P3000 | Excellent | Insoluble | 101 |

The results shown in TABLE II demonstrate that the presence of acidic groups (acid numbers ranging from about 15 to about 80) in the novolak polymeric binders in the outer layer enable low pH developability. The unmodified novolaks were not developable in the low pH developer, and when too many of the acidic groups were present, poor image quality resulted.

Note the results for Comparative Example 1 (below) are also presented in TABLE II.

Comparative Example 1

A multi-layer imageable element outside of this invention was prepared as follows:

A formulation for an outer layer was prepared by dissolving 4.8 g of PD140A, 2.1 g of P3000, 0.03 g of ethyl violet, and 0.04 g of Byk® 307 in 100 ml of diethyl ketone. This formulation was applied to the Inner layer formulation 1 that has been applied to the Substrate A and dried to give an outer layer with a coating weight of 0.56 g/m$^2$.

The resulting imageable element was imaged with test patterns at 9 W and drum speeds between 150 rpm and 360 rpm in steps of 30 rpm using a Creo Quantum® 800 imagesetter (67 to 161 mJ/cm$^2$). The resulting imaged element was developed with 980 Developer for 30 seconds to give a good image with excellent resolution and clean background at exposures greater than 101 mJ/cm$^2$.

The solubility of the upper layer resin components PD140A and P3000 in 980 Developer was evaluated by stirring 0.2 g of PD 140A and 0.1 g of P3000 in 30 ml of the developer. Insoluble residues were seen in the developer. This shows that the upper layer formulation can cause filter blockage and redeposition problems in the processor after a number of elements are imaged and developed.

The imageable element was tested for UV light sensitivity by exposing the plate to 250 mJ/cm$^2$ UV flood exposure. The element was then imaged and processed similar to the plate without UV-exposure. Strong image attack was observed and an image of poor quality was obtained.

Comparative Example 2

A single-layer imageable element outside of the present invention was prepared as follows:

The imageable layer formulation components PD494 (25 weight %) 6564LB (65.5 weight %), Crystal violet (2 weight %), Pro-Jet 825 (0.5 weight %), IR Dye A (1 weight %), and SP1077 (6 weight %) were dissolved in Dowanol® PM and MEK to a 10 w/w % solution. The formulation was coated on an electrochemically grained, anodized, and poly(vinyl phosphonic acid)-treated aluminum substrate and dried at 105° C. for 60 seconds to obtain a dry coating weight of 1.50 g/m$^2$.

The resulting imageable element was conditioned (including interleaving paper with 5% water and water proof wrapping) at 55° C. for 3 days.

Examples 7-8

Single-layer imageable elements of this invention were prepared similar to Comparative Example 2 above. The only difference was that the polymeric binders used in the imageable layer were the primary polymeric binders as shown in TABLE III below.

TABLE III

| Element Example | Primary Polymeric Binders | Novolak | Grams Novolak | Grams ClCH2COOH | NaOH | HCl | Theoretical Acid No. |
|---|---|---|---|---|---|---|---|
| Example 7 | PPB 1 | LB744 | 19.22 | 3.78 | 3.20 | 8.61 | 104 |
| Example 8 | PPB 2 | LB744 | 20.19 | 3.02 | 2.56 | 6.88 | 80 |
| Comparative Example 2 | PD494 6564LB | | | | | | 0 |

The solubility of the polymer binder(s) in 956 Developer was tested by dissolving 0.30 g of the polymer binders in 30 ml of the developer while stirring.

The imageable elements were evaluated in the following ways:

Solvent resistance: Each element was immersed in the solvent petroleum/isopropanol 90%/10% and wiped with a pad every 30 seconds up to 4 minutes. Each element was then taken out and rinsed with water. The time of first visible attack by the solvent was observed.

Developer resistance: A droplet of developer was applied to the non-imaged element every 30 seconds up to 2 minutes while both element and developer were kept at 25° C. The element was then rinsed with water and dried, and the time to an optical density loss of about 30% was evaluated.

Developability: A droplet of developer was applied to the imaged element (complete area imaged with 350 mJ/cm2) every 30 seconds up to 2 minutes while the element and developer were kept at 25° C. The element was then rinsed with water and dried.

Imaging: The elements were imaged with test patterns at 9 W and varied drum speeds corresponding to 161 to 350 mJ/cm$^2$ with a Creo Quantum® 800 imagesetter. The imaged elements were then developed by immersion in 956 Developer at 25° C. at the given dwell time, wiped with a pad, and rinsed.

The dot reproduction was evaluated by checking fine elements. The linear exposure energy was derived by visual evaluation of a 50% tonal value areas made up from lines and gaps of 10, 20, and 40 μm. The energy at which these areas showed the same optical density ("visual melting") is given.

TABLE IV

| Element | Solvent Resistance | Resistance to 956 Developer | Developability in 956 Developer | Dot Reproduction | Linear Exposure (50% tonal value) in mJ/cm² |
|---|---|---|---|---|---|
| Comparative Example 2 | 0.5 minute | >>1 minute | >>1 minute | 10 µm | No development |
| Example 8 | 2 minutes | 30 seconds | 30 seconds | 10 µm | 350 (30 second dwell in 956 Developer at 23° C.) |
| Example 7 | 2 minutes | 1 minute | 1 minute | — | 350 (60 second dwell in 956 Developer at 23° C.) |

The results for Examples 7 and 8 demonstrate that the acid groups built into the primary polymeric binders enabled low pH developer solubility. The imageable layer containing the unmodified novolak polymeric binders in Comparative Example 2 was insoluble in the low pH developer. In addition, the primary polymeric binders used in the present invention showed improved solvent resistance over the unmodified novolak binders used in Comparative Example 2.

Further, the imageable elements of this invention were positive-working and exhibited resistance to low pH developer before imaging and desired solubility after imaging. The resulting images had good resolution.

The invention has been described in detail with particular reference to certain preferred embodiments thereof, but it will be understood that variations and modifications can be effected within the spirit and scope of the invention.

The invention claimed is:

1. A positive-working imageable element comprising a substrate having thereon an ink receptive imageable layer comprising a primary polymeric binder that is soluble in an alkaline developer upon exposure to imaging radiation, said element further comprising a radiation absorbing compound, wherein said primary polymeric binder is a phenolic polymer that comprises recurring units represented in the following Structure (I):

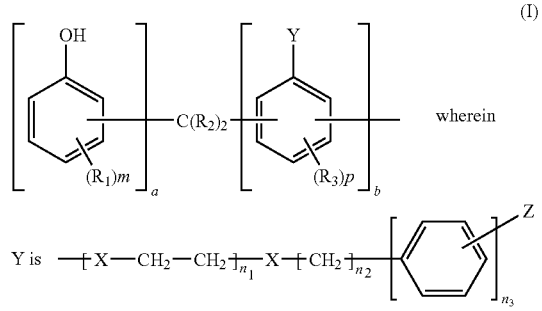

a is from about 90 to about 99 mol %, b is from about 1 to about 10 mol %, $R_1$ and $R_3$ are independently hydrogen or hydroxy, alkyl or alkoxy groups, $R_2$ is hydrogen or an alkyl group, X is an alkylene, oxy, thio, —OC(=O)Ar—, —OC(=O)CH=CH—, or —OCO(CH$_2$)$_{n4}$— group wherein Ar is an aryl group, m and p are independently 1 or 2, n1 is 0 or an integer up to 5, n2 is 0 or an integer up to 5, n3 is 0 or 1, n4 is at least 1, and Z is —C(=O)OH, —S(=O)$_2$OH, —P(=O)(OH)$_2$, or —OP(=O)(OH)$_2$.

2. The element of claim 1 wherein said primary polymeric binder is soluble upon exposure to imaging radiation only in an alkaline developer having a pH of from about 7 to about 11.

3. The element of claim 2 wherein said alkaline developer comprises benzyl alcohol, 2-phenoxyethanol, or both.

4. The element of claim 1 wherein said primary polymeric binder comprises recurring units represented in Structure (I) wherein a is from about 92 to about 98 mol % and b is from about 2 to about 8 mol %.

5. The element of claim 1 wherein $R_1$ and $R_3$ are independently hydrogen or hydroxy, methyl or methoxy groups, $R_2$ is hydrogen or a methyl group, X is a methylene, oxy, thio, —OC(=O)phenyl-, —OC(=O)CH=CH—, or —OCO(CH$_2$)$_{n4}$— group, n2 is 0, 1 or 2, n3 is 0, n4 is from 1 to 8, and Z is —C(=O)OH.

6. The element of claim 1 wherein said primary polymeric binder is present in said imageable layer at a dry coverage of from about 15 to 100 weight % based on the total dry weight of said imageable layer.

7. The element of claim 1 wherein said primary polymeric binder has an acid number of at least 15 and up to 100.

8. The element of claim 1 wherein said radiation absorbing compound is an infrared radiation absorbing compound that is present in an amount of at least 3 weight %.

9. The element of claim 1 wherein said imageable layer is the only imageable layer and comprises both said radiation absorbing compound and said primary polymeric binder.

10. The element of claim 1 that is a positive-working lithographic printing plate precursor wherein said substrate has a hydrophilic surface.

11. The imageable element of claim 1 that comprises, on said substrate, in order:
an inner layer comprising a first polymeric binder and said radiation absorbing compound, and
an ink receptive outer layer comprising a second polymeric binder that: (1) is different than said first polymeric binder, (2) is soluble in an alkaline developer upon exposure to imaging radiation, and (3) is said primary polymeric binder.

12. The element of claim 11 wherein said second polymeric binder is soluble upon exposure to imaging radiation only in an alkaline developer having a pH of from about 7 to about 11, comprises recurring units represented by Structure (I) wherein a is from about 92 to about 98 mol %, b is from about 2 to about 8 mol %, and Z is —C(=O)OH, and is present in said outer layer at a dry coverage of from about 15 to 100 weight % based on the total dry weight of said outer layer.

13. The element of claim 11 wherein said primary polymeric binder has an acid number of from about 15 to about 80.

14. The element of claim 11 wherein said radiation absorbing compound is an infrared radiation absorbing dye having a maximum absorption at from about 700 to about 1200 nm that is present in said inner layer in an amount of at least 3 weight %.

15. The element of claim 11 wherein said first polymeric binder is a (meth)acrylic resin comprising carboxy groups, a maleated wood rosin, a styrene-maleic anhydride copolymer, a (meth)acrylamide polymer, a (meth)acrylonitrile polymer, a polymer derived from an N-substituted cyclic imide, a polymer having pendant cyclic urea groups, and polymers derived from an N-alkoxyalkyl methacrylamide.

16. The element of claim 11 that is a positive-working lithographic printing plate precursor wherein said substrate comprises a hydrophilic surface.

17. A method of making an imaged element comprising:
A) imagewise exposing the imageable element of claim 1 to provide both exposed and non-exposed regions in said imageable element, and
B) developing said imagewise exposed imageable element to remove only said exposed regions.

18. The method of claim 17 wherein said developing is carried out using an alkaline developer that has a pH of from about 7 to about 11 and comprises benzyl alcohol, 2-phenoxyethanol, or both.

19. The method of claim 11 wherein said imageable element comprises a single imageable layer containing both said primary polymeric binder and said radiation absorbing compound that is an IR dye.

20. The method of claim 11 wherein said imageable element on said substrate, in order:
an inner layer comprising a first polymeric binder and said radiation absorbing compound, and
an ink receptive outer layer comprising a second polymeric binder that: (1) is different than said first polymeric binder, (2) is soluble in an alkaline developer upon exposure to imaging radiation, and (3) is said primary polymeric binder.

\* \* \* \* \*